(12) United States Patent
Chang et al.

(10) Patent No.: US 8,928,159 B2
(45) Date of Patent: Jan. 6, 2015

(54) ALIGNMENT MARKS IN SUBSTRATE HAVING THROUGH-SUBSTRATE VIA (TSV)

(75) Inventors: Hsin Chang, Hsin-Chu (TW); Fang Wen Tsai, Hsin-Chu (TW); Jing-Cheng Lin, Hsin-Chu (TW); Wen-Chih Chiou, Miaoli (TW); Shin-Puu Jeng, Hsin-Chu (TW)

(73) Assignee: Taiwan Semiconductor Manufacturing & Company, Ltd., Hsin-Chu (TW)

( * ) Notice: Subject to any disclaimer, the term of this patent is extended or adjusted under 35 U.S.C. 154(b) by 702 days.

(21) Appl. No.: 12/874,952

(22) Filed: Sep. 2, 2010

(65) Prior Publication Data

US 2012/0056315 A1   Mar. 8, 2012

(51) Int. Cl.
*H01L 23/48*   (2006.01)
*H01L 21/683*  (2006.01)
*H01L 21/768*  (2006.01)
*H01L 23/544*  (2006.01)
*H01L 23/00*   (2006.01)
*H01L 23/498*  (2006.01)

(52) U.S. Cl.
CPC ...... *H01L 21/6835* (2013.01); *H01L 21/76898* (2013.01); *H01L 23/481* (2013.01); *H01L 23/544* (2013.01); *H01L 24/03* (2013.01); *H01L 24/11* (2013.01); *H01L 23/49827* (2013.01); *H01L 24/05* (2013.01); *H01L 24/13* (2013.01); *H01L 2221/68327* (2013.01); *H01L 2221/68381* (2013.01); *H01L 2223/5442* (2013.01); *H01L 2223/54426* (2013.01); *H01L 2224/03002* (2013.01); *H01L 2224/03912* (2013.01); *H01L 2224/0401* (2013.01); *H01L 2224/05166* (2013.01); *H01L 2224/05181* (2013.01); *H01L 2224/05187* (2013.01); *H01L 2224/05647* (2013.01); *H01L 2224/11002* (2013.01); *H01L 2224/1146* (2013.01); *H01L 2224/1147* (2013.01); *H01L 2924/01029* (2013.01); *H01L 2924/01073* (2013.01); *H01L 2924/01023* (2013.01); *H01L 2924/01033* (2013.01); *H01L 2924/0105* (2013.01); *H01L 2924/01074* (2013.01); *H01L 2924/01077* (2013.01); *H01L 2924/01327* (2013.01); *H01L 2221/6834* (2013.01)
USPC ............ 257/797; 257/E23.011; 257/E23.067; 257/737; 257/774

(58) Field of Classification Search
USPC ........... 257/737, E23.067, E23.011, E23.145, 257/E23.174, 774, 797
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,087,719 A * | 7/2000 | Tsunashima .................. 257/686 |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |

(Continued)

FOREIGN PATENT DOCUMENTS

JP   2009-277719 A   11/2009

*Primary Examiner* — S. V. Clark
*Assistant Examiner* — Krista Soderholm
(74) *Attorney, Agent, or Firm* — Slater & Matsil, L.L.P.

(57) ABSTRACT

A device includes a substrate, and an alignment mark including a conductive through-substrate via (TSV) penetrating through the substrate.

20 Claims, 9 Drawing Sheets

(56) References Cited

U.S. PATENT DOCUMENTS

| | | | |
|---|---|---|---|
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,469 B2 * | 1/2005 | Sawada et al. | 438/629 |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 * | 10/2006 | Matsui | 257/797 |
| 7,157,787 B2 | 1/2007 | Kim et al. | |
| 7,161,231 B2 | 1/2007 | Koike | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 8,017,439 B2 * | 9/2011 | Takahashi et al. | 438/109 |
| 8,089,161 B2 | 1/2012 | Komuro | |
| 8,102,064 B2 * | 1/2012 | Renn | 257/797 |
| 8,227,295 B2 * | 7/2012 | Simmons-Matthews et al. | 438/109 |
| 2008/0090308 A1 * | 4/2008 | Noda et al. | 438/3 |
| 2010/0171226 A1 | 7/2010 | West et al. | |
| 2011/0095435 A1 * | 4/2011 | Volant et al. | 257/774 |
| 2011/0198721 A1 * | 8/2011 | Yang et al. | 257/506 |

* cited by examiner

ALIGNMENT MARKS IN SUBSTRATE HAVING THROUGH-SUBSTRATE VIA (TSV)

BACKGROUND

In order to form three-dimensional (3D) integrated circuit structures, through-substrate vias (TSVs) are used to electrically couple front-side features to the backside features of a wafer. On the front side, there may be interconnect structures and metal bumps, for example. On the backside, there may be metal bumps and redistribution lines. Dual-side alignment needs to be performed in order to accurately align the backside features and the front-side features with each other.

Typically, the front-side features are formed on the wafer first, followed by a backside grinding to thin a silicon substrate in the wafer, until the TSVs are exposed. Front-side alignment marks are incorporated in the front-side features. The dual-side alignment is performed from the backside using an infra-red (IR) alignment system for locating the front-side alignment marks, wherein the infra-red light emitted by the IR alignment system penetrates through the thinned silicon substrate to reach the front-side alignment marks. Backside alignment marks are then made on the backside of the wafers by etching into the backside layer(s) and into the silicon substrate.

Due to the limitation of the IR alignment system, and further due to the thickness variation in the grinded silicon substrate, the accuracy of the dual-side alignment is low, and the misalignment may be as high as about 2 μm.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel dual-side alignment mark and methods of forming the same are provided in accordance with an embodiment. The intermediate stages of manufacturing the dual-side alignment marks are illustrated in accordance with an embodiment. The variations of the embodiments are then discussed. Throughout the various views and illustrative embodiments, like reference numbers are used to designate like elements.

Figure 1:
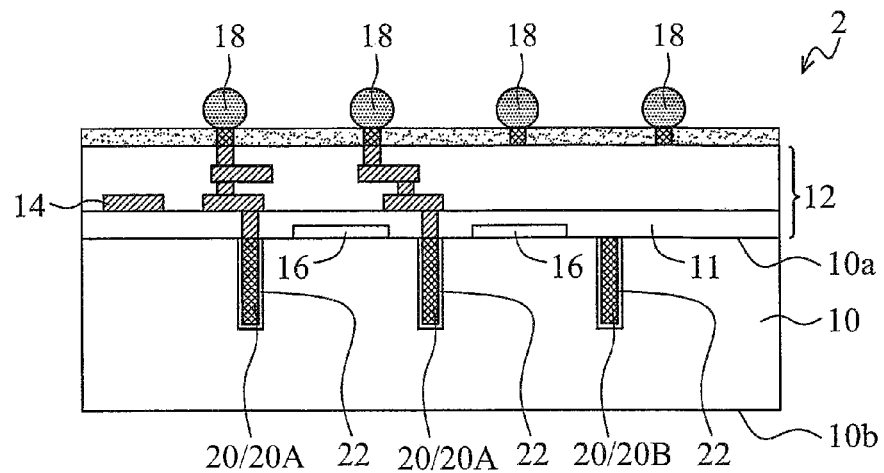
FIGS. 1 through 7 are cross-sectional views of intermediate stages in the manufacturing and using of alignment marks in accordance with an embodiment.

Referring to FIG. 1, wafer 2, which includes substrate 10, is provided. In an embodiment, substrate 10 is a semiconductor substrate, such as a bulk silicon substrate, although it may include other semiconductor materials such as group III, group IV, and/or group V elements. Integrated circuit devices 16, which may include transistors, may be formed at front surface 10a of substrate 10. In alternative embodiments, wafer 2 is an interposer or a package substrate, which may not include active devices such as transistors therein. However, passive devices such as transistors and capacitors may be included in wafer 2. Substrate 10 thus may be formed of a semiconductor material such as silicon or formed of a dielectric material. Interconnect structure 12 including metal lines and vias formed therein is formed over substrate 10, and may be electrically coupled to the integrated circuit devices. The metal lines and vias may be formed of copper or copper alloys, and may be formed using the well-known damascene processes. Interconnect structure 12 may include commonly known inter-layer dielectric (ILD) 11 and inter-metal dielectrics (IMDs), which are formed over ILD 11.

Figure 8:
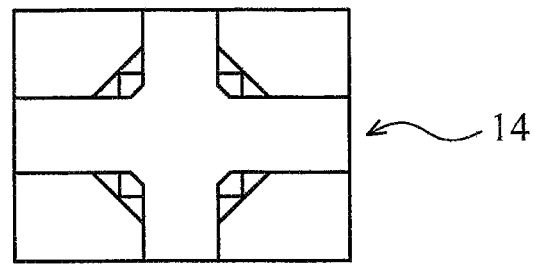
FIG. 8 illustrates a top view of a front-side alignment mark.

Alignment mark 14 is formed on the front side of substrate 10, and may be formed, for example, in the first-level metal layer (the bottom IMD layer), although it may be formed in other-level metal layers. A top view of an exemplary alignment mark 14 is illustrated in FIG. 8. Alignment mark 14 may have different shapes other than what is shown in FIG. 8.

Through-substrate vias (TSVs) 20 are formed in substrate 10, and extend from front surface 10a of substrate 10 into substrate 10. Depending on whether TSVs 20 are formed using a via-first approach or a via-last approach, TSVs 20 may extend into ILD 11 that is used to cover the active devices, but not into the IMD layers in interconnect structure 12. Alternatively, TSVs 20 may penetrate through both substrate 10, ILD 11, and possibly interconnect structure 12. Isolation layers 22 are formed on the sidewalls of TSVs 20, and electrically insulate the respective TSVs 20 from substrate 10. Isolation layers 22 may be formed of commonly used dielectric materials such as silicon nitride, silicon oxide (for example, tetra-ethyl-ortho-silicate (TEOS) oxide), and the like.

TSVs 20 include functional TSVs 20A and alignment-mark TSVs 20B. Although only one alignment-mark TSV 20B is illustrated, there may be a plurality of alignment-mark TSVs 20B, as illustrated in FIGS. 9A through 9G and FIGS. 11A through 11D. Functional TSVs 20A may be used to electrically couple the conductive features on the front side of substrate 10 to the conductive features on the backside of substrate 10. Alignment-mark TSVs 20B are used for aligning the features on the backside to the features on the front side of wafer 2. Alignment-mark TSVs 20B and alignment mark 14 are aligned to each other. In an embodiment, functional TSVs 20A and alignment-mark TSVs 20B are formed simultaneously. In alternative embodiments, functional TSVs 20A and alignment-mark TSVs 20B are formed at different times by separate formation processes. Further, functional TSVs 20A may have a same diameter, a same pitch, and/or a same height as alignment-mark TSVs 20B. Alternatively, the diameter, the pitch, and/or the height of functional TSVs 20A may be different from that of alignment-mark TSVs 20B. Metal bumps 18 may then be formed on the front side of wafer 2.

Figure 2:
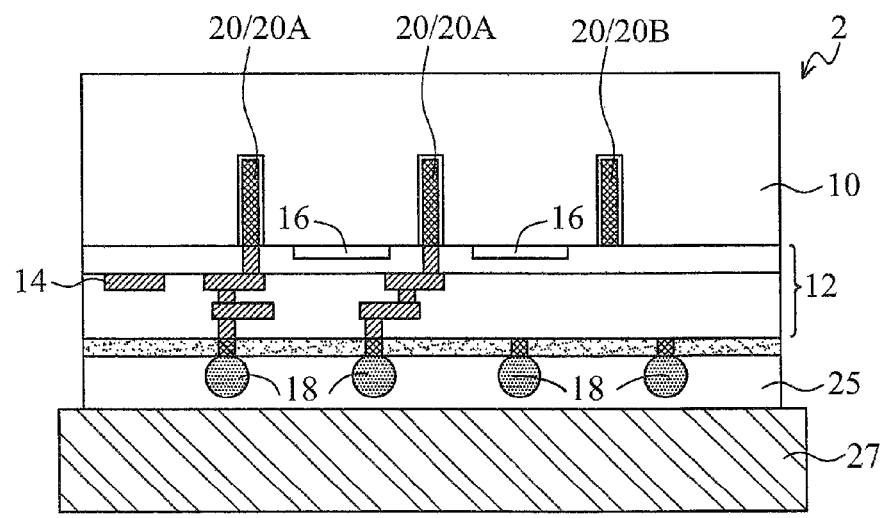
Figure 3:
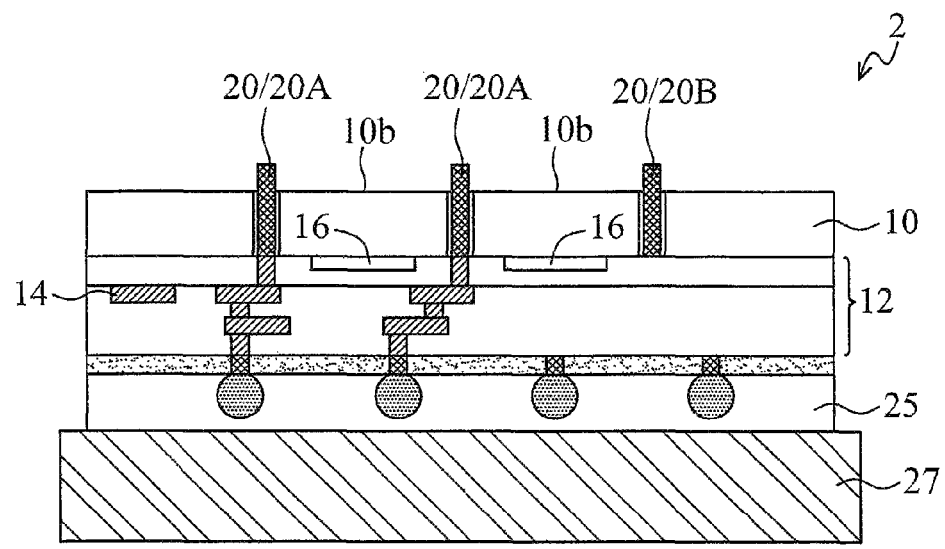

Referring to FIG. 2, wafer 2 is bonded to carrier 27, for example, through adhesive 25, which may be ultra-violet (UV) glue. Next, as shown in FIG. 3, a backside grinding is performed to remove excess portions of substrate 10. An etch may further be performed to lower back surface 10b of substrate 10, so that TSVs 20 protrude above back surface 10b.

Figure 4:
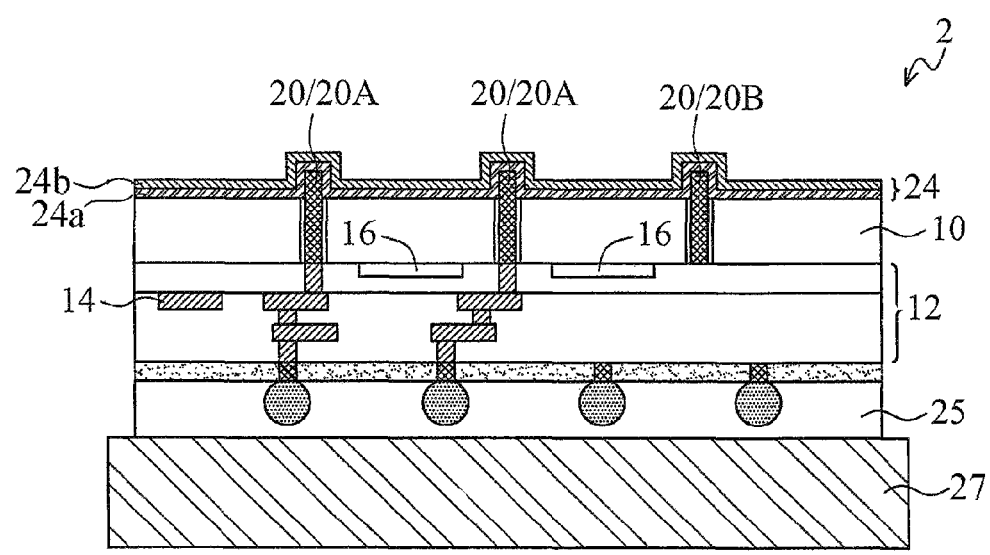

In FIG. 4, passivation layer 24 is formed to cover back surface 10b of substrate 10 and TSVs 20. In an exemplary embodiment, passivation layer 24 includes silicon nitride layer 24a and silicon oxynitride layer 24b over silicon nitride layer 24a, although passivation layer 24 may be formed different materials and/or have different structures.

Figure 5:
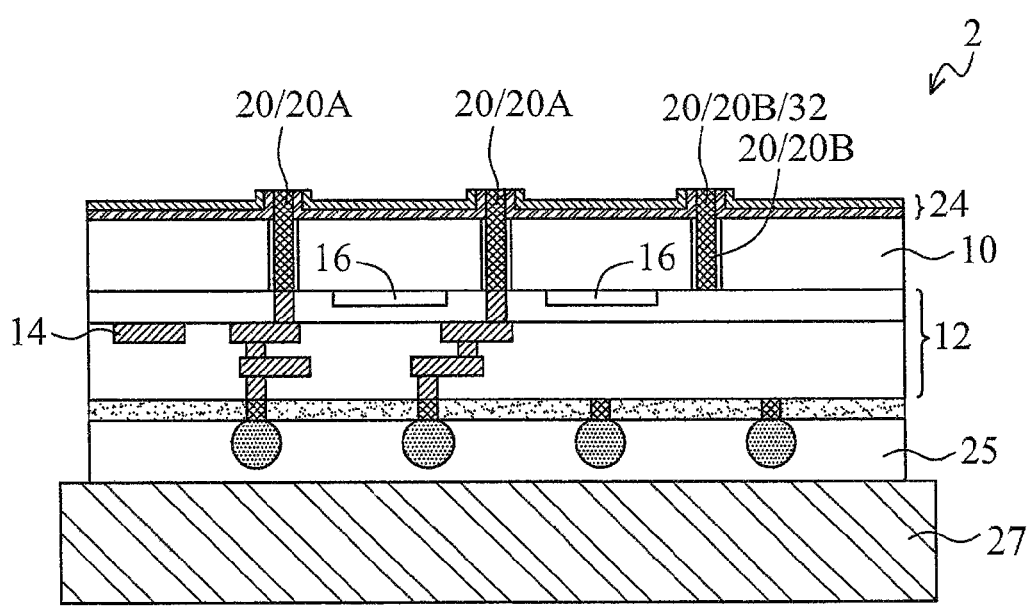

Next, using a patterned photo resist, portions of passivation layer 24 are etched, and the ends of TSVs 20 (including functional TSVs 20A and alignment-mark TSVs 20B) are exposed. The patterned photo resist is then removed, resulted in a structure shown in FIG. 5. The exposed alignment-mark TSVs 20B may thus be used as alignment mark 32, which are used for the alignment in the formation of backside features such as RDLs and/or metal bumps, so that the backside features on the backside of wafer 2 may be accurately aligned to desirable positions, and aligned to front-side alignment mark 14.

Figure 6:
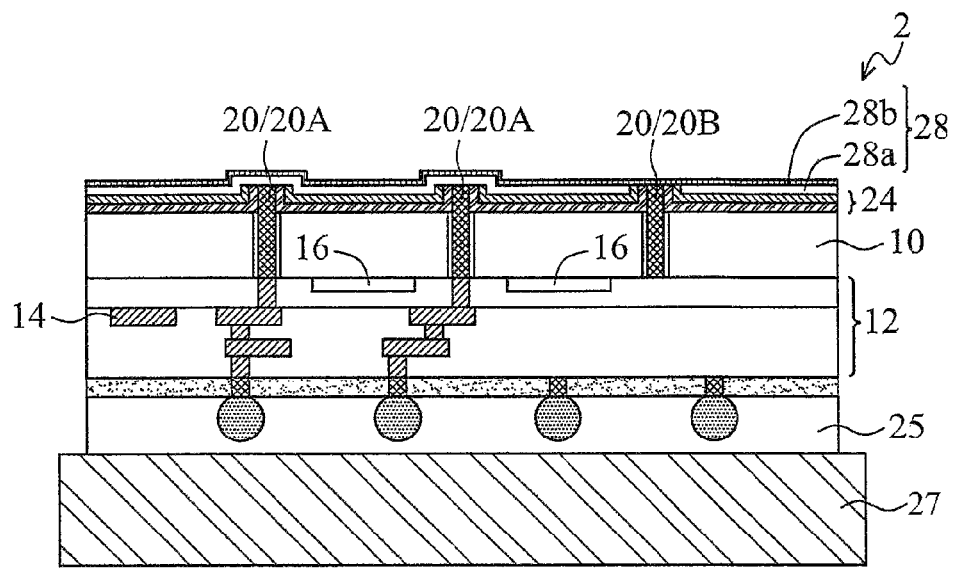

FIG. 6 illustrates the formation of under-bump metallurgy (UBM) layer 28, which may be blanket formed on passivation layer 24 and exposed TSVs 20, for example. UBM layer 28 may be formed using sputtering or other applicable methods. UBM layer 28 may include a barrier layer 28a and a seed layer 28b on barrier layer 28a. In some embodiments, barrier layer 28a includes a Ti layer, a Ta layer, a TiN layer, a TaN layer, or combinations thereof, although other materials may also be used. In some embodiments, the seed layer 28b includes copper.

Figure 7:
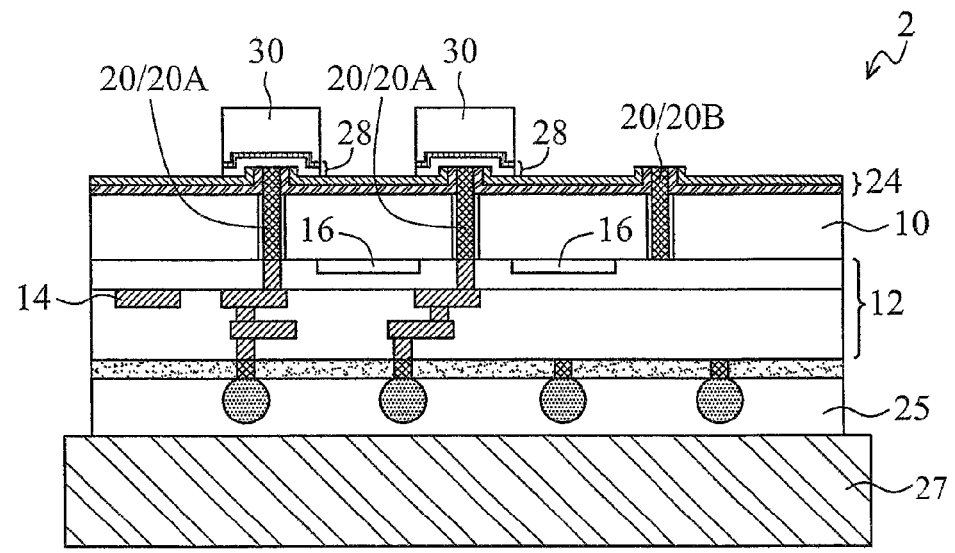

FIG. 7 illustrates the formation of exemplary backside features on the backside of wafer, wherein the backside features may include metal layers, metal bumps, passivation layers, micro bumps, and/or the like. In the exemplary embodiment as shown in FIG. 7, backside features 30 represent metal bumps and/or redistribution lines (RDLs). It is appreciated that although one layer of metal bumps/RDLs is shown, there may be one or more layer of RDLs, and metal bumps over and connected to the RDLs. In an exemplary embodiment, the formation of features 30 includes forming a mask (not shown) over UBM layer 28, with a portion of UBM layer 28 exposed through openings in the mask. A plating is then performed to plate a conductive material into the openings to form backside features 30. The mask is then removed, and the portions of the UBM layer 28 previously covered by the mask are etched. Alignment-mark TSVs 20B are also exposed, and may be used for the alignment in the formation of additional features such as RDLs and/or metal bumps over backside features 30.

Figure 9A:
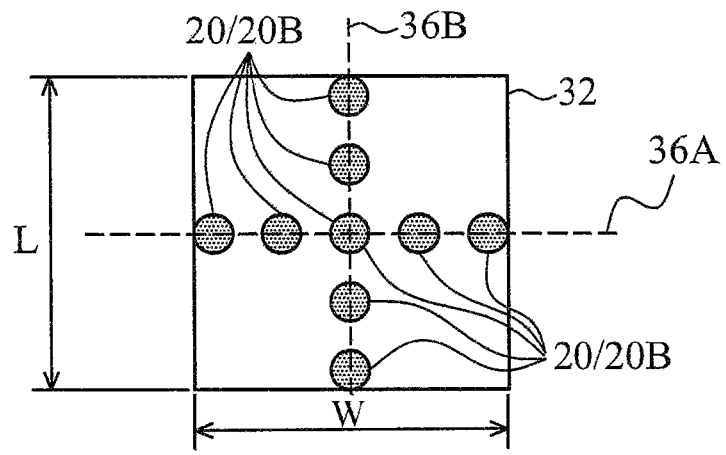
FIGS. 9A through 9G illustrate various alignment marks formed of through-substrate vias (TSVs)
Figure 9B:
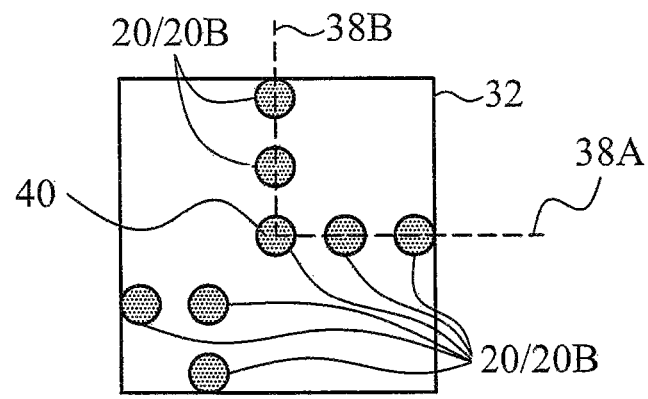
Figure 9C:
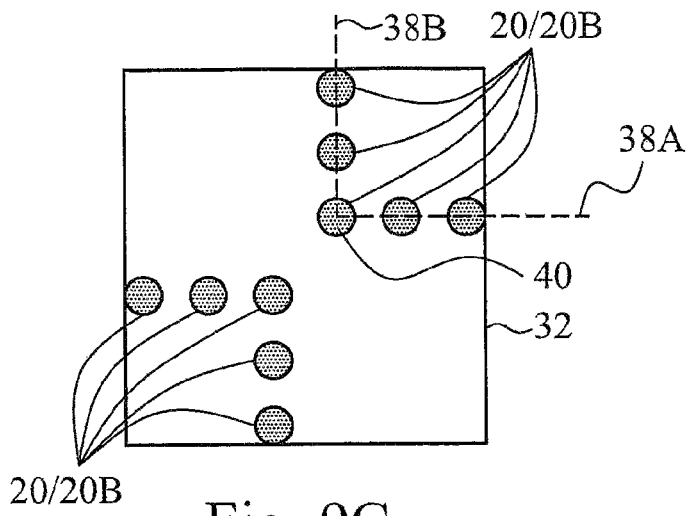
Figure 9D:
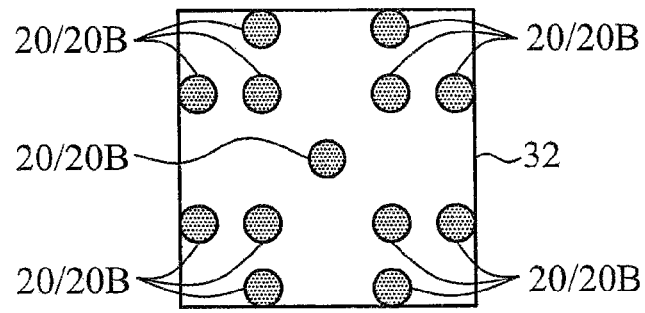
Figure 9E:
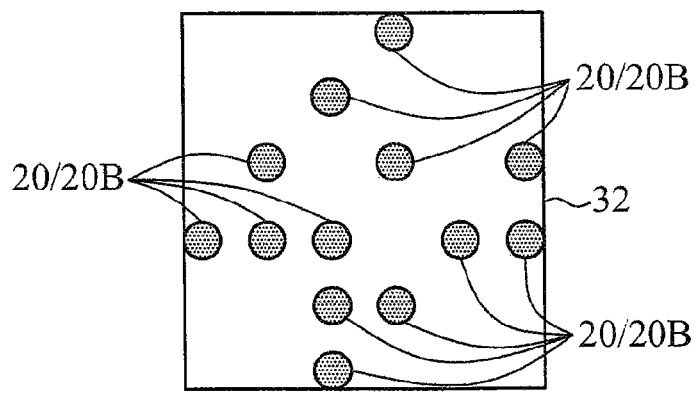
Figure 9F:
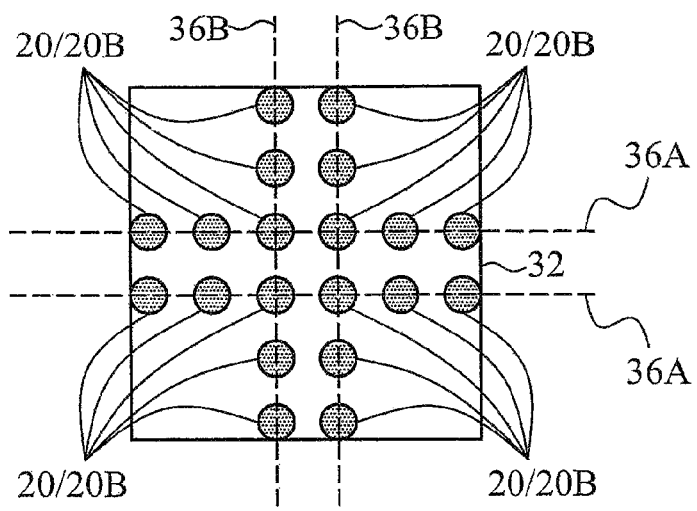
Figure 9G:
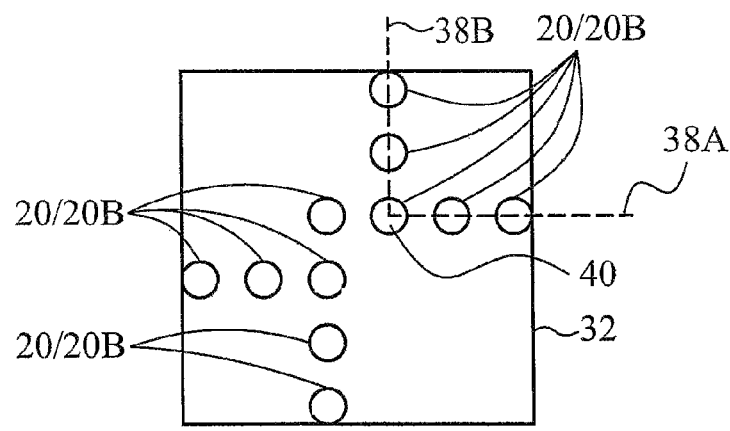

FIGS. 9E through 9G illustrate top views of exemplary alignment marks 32, each formed of a plurality of alignment-mark TSVs 20B. When the plurality of alignment-mark TSVs 20B are grouped to form alignment mark 32, the plurality of alignment-mark TSVs 20B may be arranged in an rectangular region (also marked as 32) having length L and width W, wherein the rectangular region may be free from functional TSVs. Length L and width W may be between about 50 µm and about 400 µm, and may be between about 100 µm and about 200 µm. Accordingly, the rectangular region may have a top-view area smaller than about 400 µm×400 µm, or less than about 200 µm×200 µm.

In FIGS. 9A through 9G, alignment-mark TSVs 20B may be arranged as different patterns. For example, in FIGS. 9A and 9F, alignment-mark TSVs 20B are aligned to lines 36A and 36B that cross each other. In FIGS. 9B, 9C, and 9G, alignment-mark TSVs 20B are aligned to lines 38A and 38B that terminate at common points 40. FIGS. 9D and 9E illustrate other exemplary patterns.

Figure 10:
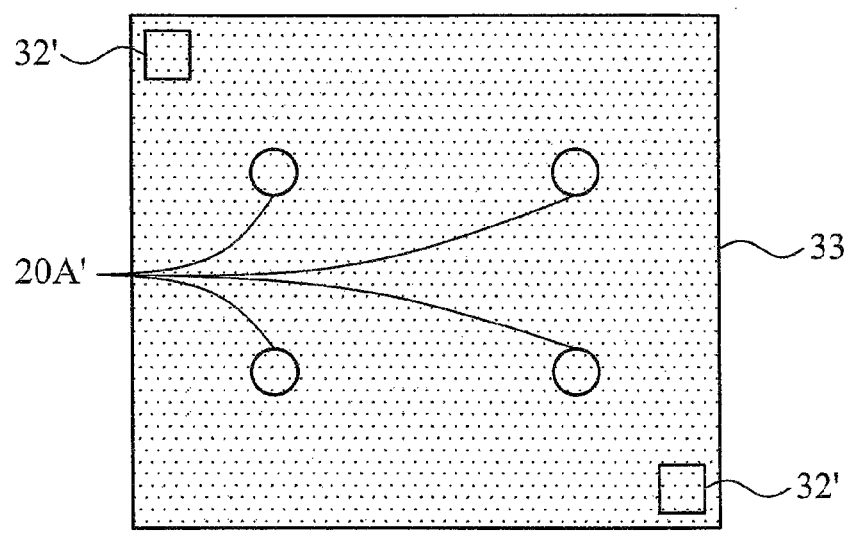
FIG. 10 illustrates a lithography mask for forming the TSVs.
Figure 11A:
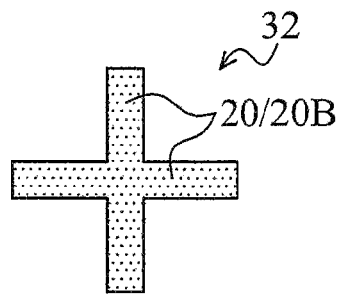
FIGS. 11A through 11D illustrate various alignment marks formed of trench-type TSVs.
Figure 11B:
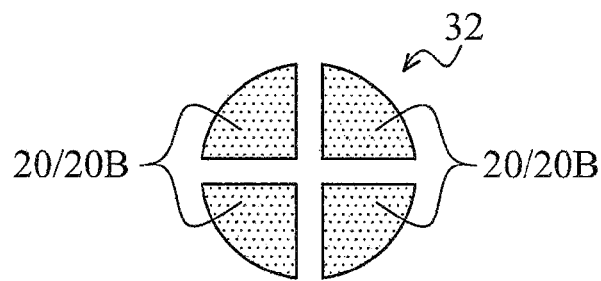
Figure 11C:
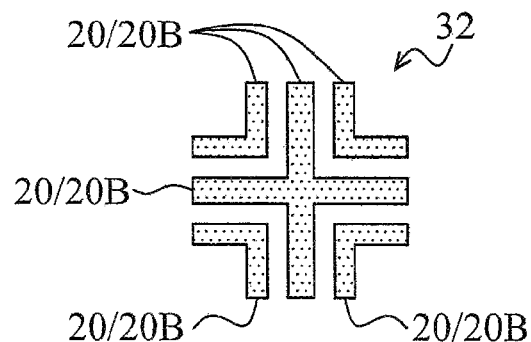
Figure 11D:
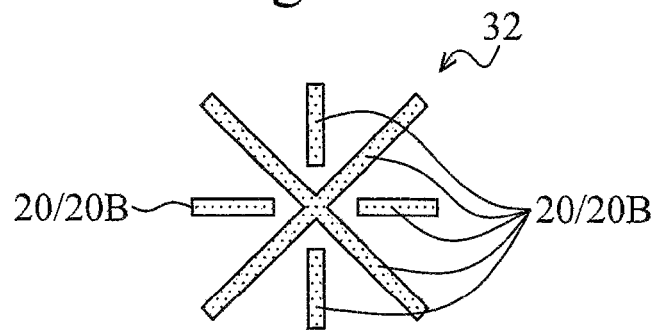

FIG. 10 illustrates an exemplary lithography mask 33 for forming TSVs 20, wherein alignment mark patterns 32' are formed in lithography mask 33 along with patterns 20A' for forming functional TSVs 20. Alignment-mark patterns 32' define the patterns of alignment-mark TSVs 20B, while patterns 20A' define the patterns of functional TSVs 20A.

FIGS. 11A through 11D illustrate alternative embodiments in which alignment marks 32 are formed of trench-type TSVs 20B, which, instead of having circular top-view shapes, may have other shapes including, but are not limited to, rectangles, crosses, and combinations thereof. Trench-type TSVs 20B may be formed at the same time as, or at different times than, forming functional TSVs 20A. Similarly, trench-type TSVs 20B also penetrate through substrate 10.

By using the embodiments, alignment marks may be formed at the same time functional TSVs are formed. Therefore, the cost incurred in conventional alignment-mark formation processes, including forming a photo resist for defining the patterns of backside alignment marks on the backside of wafer 2, etching wafer 2 for forming the backside alignment marks, and stripping off the photo resist is saved. Further, the accuracy for forming the alignment marks is improved. In conventional alignment mark formation techniques, the misalignment may be as great as about 2 µm. While in the embodiments, the misalignment is reduced to less than 1 µm.

Features in accordance with embodiments include a substrate, and an alignment mark including a conductive TSV penetrating through the substrate.

Features in accordance with further embodiments include a semiconductor substrate having a front surface and a back surface; a functional TSV penetrating through the semiconductor substrate; an active device on a front side of the semiconductor substrate; an interconnect structure including a plurality of metal layers on the front side of the semiconductor substrate; a dielectric layer contacting a back surface of the semiconductor substrate; and an alignment mark including a plurality of TSVs. The plurality of TSVs penetrates through the semiconductor substrate and the dielectric layer, wherein no redistribution line and metal bump is on a back side of the semiconductor substrate and electrically coupled to the plurality of TSVs.

Features in accordance with embodiments include a semiconductor substrate having a front surface and a back surface; a functional TSV in the semiconductor substrate and extending from the front surface to the back surface; an interconnect structure including a plurality of metal layers on a front side of the semiconductor substrate; an alignment mark on the front side of the semiconductor substrate; a dielectric layer contacting the back surface of the semiconductor substrate; and a plurality of TSVs penetrating through the semiconductor substrate. No redistribution line and metal bump is formed on a backside of the semiconductor substrate and electrically coupled to the plurality of TSVs.

Features in accordance with embodiments include providing a substrate; forming a first and a second conductive TSV in the substrate; and forming a conductive feature on a backside of the substrate and electrically coupled to the second conductive TSV. The step of forming the conductive feature is performed using the first conductive TSV as an alignment mark. No additional conductive feature is formed to electrically couple to the first conductive TSV and at a same level as the conductive feature.

Features in accordance with embodiments include providing a substrate; forming a functional TSV and a plurality of TSVs in the substrate, wherein the plurality of TSVs are grouped to form an alignment mark; forming an interconnect structure on a front side of the substrate; grinding a backside of the substrate until the functional TSV and the alignment mark are exposed; forming a dielectric layer contacting a back surface of the substrate, the functional TSV, and the alignment mark; etching the dielectric layer to expose the functional TSV and the alignment mark; forming an underbump-metallurgy (UBM) layer to cover the dielectric layer and to contact the functional TSV and the alignment mark; and forming a conductive feature directly over and electrically coupled to the functional TSV, wherein the step of forming the conductive feature is performed using the alignment mark for alignment.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a substrate comprising two major surfaces on opposite sides of the substrate, wherein the substrate is a semiconductor substrate, and wherein no active device is formed at either one of the two major surfaces of the substrate;
   a first alignment mark comprising a first conductive through-substrate via (TSV) penetrating through the substrate and extending from the a first one of the two major surfaces to a second one of the two major surfaces; and
   a dielectric layer on a backside of the substrate, wherein the first conductive TSV penetrates through the dielectric layer.

2. The device of claim 1, wherein the first alignment mark comprises a plurality of first conductive TSVs penetrating through the substrate.

3. The device of claim 2, wherein the plurality of first conductive TSVs are arranged in a rectangular region.

4. The device of claim 2, wherein the plurality of first conductive TSVs are aligned into two lines crossing each other.

5. The device of claim 1, further comprising a conductive feature over a backside of the substrate, wherein the conductive feature is not electrically coupled to the first conductive TSV.

6. The device of claim 1, wherein the first conductive TSV is electrically floating.

7. The device of claim 1, further comprising a second alignment mark on a front side of the substrate, wherein the second alignment mark includes a metal layer.

8. The device of claim 1, further comprising a second conductive TSV penetrating through the substrate and not electrically floating.

9. The device of claim 8, wherein the first conductive TSV and the second conductive TSV have substantially a same diameter.

10. The device of claim 8, wherein the first conductive TSV and the second conductive TSV have substantially a same height.

11. The device of claim 8, wherein the first conductive TSV and the second conductive TSV have substantially a same top-view shape.

12. The device of claim 8 further comprising a conductive feature on a backside of the substrate and electrically coupled to the second conductive TSV, wherein the conductive feature includes at least one of a redistribution line and a metal bump.

13. A method of forming a device, the method comprising:
   forming a first and a second conductive through-substrate via (TSV) in a substrate;
   performing a backside grinding on a backside of the substrate, wherein the first and the second conductive TSVs are exposed through a back surface of the substrate;
   recessing the back surface of the substrate to make the first and the second conductive TSVs to protrude beyond the back surface;
   forming a passivation layer on the back surface of the substrate;
   removing portions of the passivation layers that overlap the first and the second conductive TSVs to expose the first and the second conductive TSVs; and
   forming a conductive feature on a backside of the substrate and electrically coupled to the second conductive TSV by using the first conductive TSV as an alignment mark.

14. The method of claim 13, wherein the conductive feature comprises at least one of a redistribution line and a metal bump.

15. The method of claim 13, wherein the conductive feature is not electrically coupled to the first conductive TSV.

16. The method of claim 13, further comprising forming an additional alignment mark on a front side of the substrate.

17. The method of claim 13 further comprising forming an interconnect structure on a front side of the substrate, wherein the interconnect structure is not electrically coupled to the first conductive TSV.

18. The method of claim 13, wherein the forming the conductive feature comprises forming a redistribution line.

19. The method of claim 13, wherein the forming the conductive feature comprises forming a metal bump.

20. The method of claim 13, wherein the substrate further comprises a front surface opposite to the back surface, wherein a transistor is formed at the front surface of the substrate.

* * * * *